(12) United States Patent
Honkura et al.

(10) Patent No.: US 10,483,779 B2
(45) Date of Patent: Nov. 19, 2019

(54) STATUS DETERMINING METHOD FOR SECONDARY BATTERY, STATUS DETERMINING APPARATUS FOR SECONDARY BATTERY, SECONDARY BATTERY SYSTEM, AND CHARGE/DISCHARGE CONTROL APPARATUS HAVING STATUS DETERMINING APPARATUS

(71) Applicant: HITACHI, LTD., Tokyo (JP)

(72) Inventors: Kohei Honkura, Tokyo (JP); Yutaka Okuyama, Tokyo (JP)

(73) Assignee: HITACHI, LTD., Tokyo (JP)

( * ) Notice: Subject to any disclaimer, the term of this patent is extended or adjusted under 35 U.S.C. 154(b) by 761 days.

(21) Appl. No.: 14/915,989

(22) PCT Filed: Sep. 25, 2013

(86) PCT No.: PCT/JP2013/075790
§ 371 (c)(1),
(2) Date: Mar. 2, 2016

(87) PCT Pub. No.: WO2015/045015
PCT Pub. Date: Apr. 2, 2015

(65) Prior Publication Data
US 2016/0204639 A1    Jul. 14, 2016

(51) Int. Cl.
*H01M 10/48*  (2006.01)
*H01M 10/42*  (2006.01)
(Continued)

(52) U.S. Cl.
CPC ......... *H02J 7/0068* (2013.01); *H01M 10/425* (2013.01); *H01M 10/48* (2013.01); *G01R 31/392* (2019.01)

(58) Field of Classification Search
CPC .... H02J 7/0068; H01M 10/425; H01M 10/48; G01R 31/3679
See application file for complete search history.

(56) References Cited

U.S. PATENT DOCUMENTS

| 8,615,372 B2* | 12/2013 | Tomura | H01M 10/48 702/63 |
| 8,742,725 B2* | 6/2014 | Tsujiko | H01M 10/48 320/132 |
| 9,547,046 B2* | 1/2017 | Tao | H01M 10/052 |

FOREIGN PATENT DOCUMENTS

| EP | 0987555 A2 | 9/1999 |
| EP | 2053414 B1 | 4/2009 |

(Continued)

OTHER PUBLICATIONS

"Advances in Lithium-Ion Batteries", Edited by W. van Schalkwijk and B. Scrosati, Kluwer Academic/Plenum Publishers, 2002.

(Continued)

*Primary Examiner* — Amy Cohen Johnson
*Assistant Examiner* — Paul Baillargeon
(74) *Attorney, Agent, or Firm* — Volpe and Koenig, P.C.

(57) ABSTRACT

To accurately determine a deterioration state of a secondary battery with respect to a practical current value. Provided are a state determination device of a secondary battery, a state determination method of a secondary battery, a secondary battery system, and a charge and discharge control apparatus having the state determination device. In the state determination device of the secondary battery having a positive electrode and a negative electrode, a capacity reduction parameter group A is determined based on charge and discharge characteristics per reference quantity of the positive electrode and the negative electrode and a current value A, and a resistance increase parameter group B is determined based on the charge and discharge characteristics per (Continued)

reference quantity of the positive electrode and the negative electrode, the capacity reduction parameter group A, and a current value B which is larger than the current value A.

7 Claims, 7 Drawing Sheets

(51) Int. Cl.
    *G01R 31/36*     (2019.01)
    *H02J 7/00*     (2006.01)
    *G01R 31/392*     (2019.01)

(56) References Cited

FOREIGN PATENT DOCUMENTS

| | | |
|---|---|---|
| JP | 2000-150003 A | 5/2000 |
| JP | 2009-080093 A | 4/2009 |
| WO | 2010/026930 A1 | 3/2010 |

OTHER PUBLICATIONS

European Search Report for European Office Action 13894718.9 dated Mar. 28, 2017.

\* cited by examiner

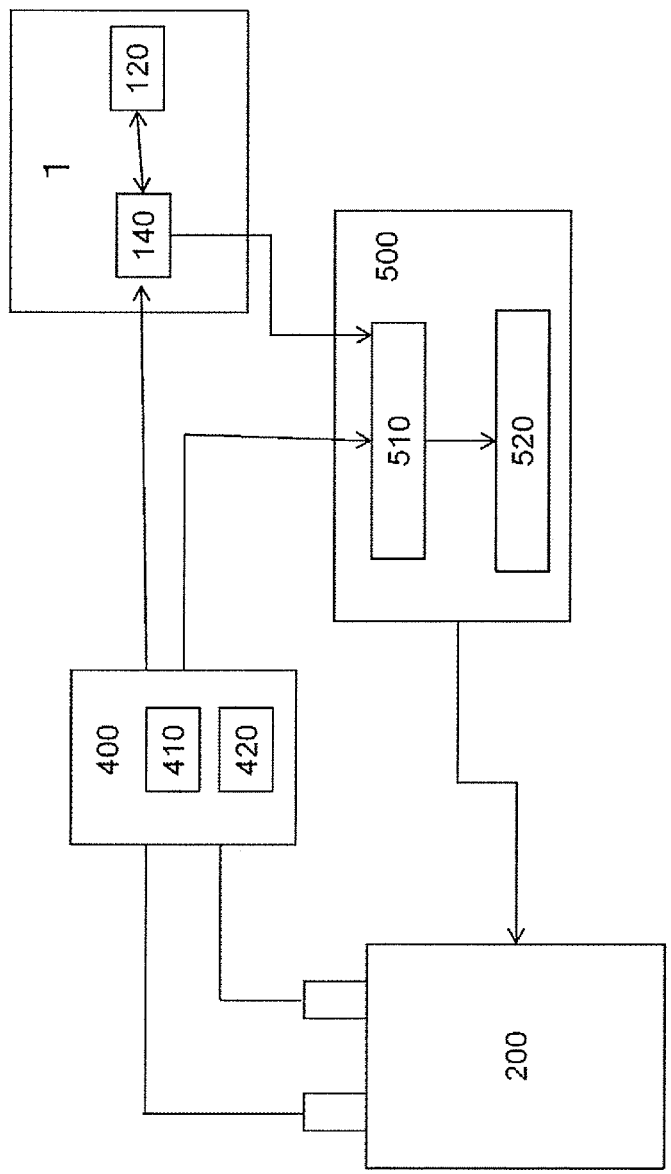

STATUS DETERMINING METHOD FOR SECONDARY BATTERY, STATUS DETERMINING APPARATUS FOR SECONDARY BATTERY, SECONDARY BATTERY SYSTEM, AND CHARGE/DISCHARGE CONTROL APPARATUS HAVING STATUS DETERMINING APPARATUS

TECHNICAL FIELD

The present invention relates to a state determination method of a secondary battery, a state determination device of a secondary battery, a secondary battery system, and a charge and discharge control apparatus having the state determination device.

BACKGROUND ART

In recent years, an effort to efficiently utilize energy has been made by using a secondary battery, such as a lithium ion battery, for a power supply mounted on a vehicle or a power supply for storing electricity in a smart house. However, it is known that characteristic deterioration of the secondary battery is caused by charge, discharge and storage thereof. Since it is assumed that the power supplies for the above-described uses are utilized over a long period of time, it is important to suppress the characteristic deterioration of the secondary battery.

As a means for suppressing the deterioration, it is effective to detect accurately deterioration states of a positive electrode and a negative electrode of the secondary battery and select an optimum using method for the battery according to the detected deterioration states. For example, PTL 1 describes a method in which deterioration states of a positive electrode, a negative electrode, and an electrolytic solution are respectively quantitatively evaluated in a non-destructive manner by utilizing a charging and discharging curve of a secondary battery. Further, NPL 1 discloses a method of calculating a discharging curve.

CITATION LIST

Patent Literature

PTL 1: JP Patent Publication (Kokai) 2009-80093 A

Non-Patent Literature

NPL 1: Advances in Lithium-Ion Batteries: ISBN0-306-47356-9

SUMMARY OF INVENTION

Technical Problem

PTL 1 describes a state determination method of a secondary battery, and describes the method in which a charging and discharging curve of the secondary battery is reproduced by calculation based on separate charging and discharging curves of a positive electrode and a negative electrode stored in advance, and in which an effective weight of a positive electrode active material, an effective weight of a negative electrode active material, a capacity deviation between the positive electrode and the negative electrode, or values of parameters corresponding thereto are obtained in the process. However, in the state determination method described in PTL 1 mentioned above, it is necessary to eliminate influence of internal resistance included in the charging and discharging curve of the secondary battery as much as possible. Accordingly, a current value when measuring the charging and discharging curve must be made small, and evaluation is performed on the charging and discharging curve different from a charging and discharging curve obtained by a practical current value. Additionally, the internal resistance of the secondary battery cannot be evaluated.

Further, when the charging and discharging curve obtained by the practical current value of the secondary battery is evaluated, the charging and discharging curve is influenced by a mixture of the effective weights of the positive and negative electrode active materials, the capacity deviation between the positive electrode and the negative electrode serving as capacity parameters which affect both an open circuit state and a closed circuit state, and the internal resistance parameter which affects only the closed circuit state. Accordingly, it is difficult to separate these parameters accurately.

In consideration of such problems, an object of the present invention is to provide a state determination method of a secondary battery and a state determination device of a secondary battery capable of accurately determining a deterioration state of the secondary battery with respect to a practical current value, and to provide a secondary battery system and a charge and discharge control apparatus having the state determination device.

Solution to Problem

A solution to solve the aforementioned problems, for example, is as follows.

A state determination device of a secondary battery having a positive electrode and a negative electrode, wherein a capacity reduction parameter group A is determined based on charge and discharge characteristics per reference quantity of the positive electrode and the negative electrode and a current value A, and a resistance increase parameter group B is determined based on the charge and discharge characteristics per reference quantity of the positive electrode and the negative electrode, the capacity reduction parameter group A, and a current value B which is larger than the current value A.

Advantageous Effects of Invention

According to the present invention, a deterioration state determination method of a secondary battery and a state determination device of a secondary battery capable of accurately determining a deterioration state of the secondary battery with respect to a practical current value can be provided. Problems, configurations, and effects other than those described above are made clear by description of the following embodiments.

BRIEF DESCRIPTION OF DRAWINGS

FIG. 8 illustrates a secondary battery system in the embodiment of the present invention.

DESCRIPTION OF EMBODIMENTS

Figure 1:
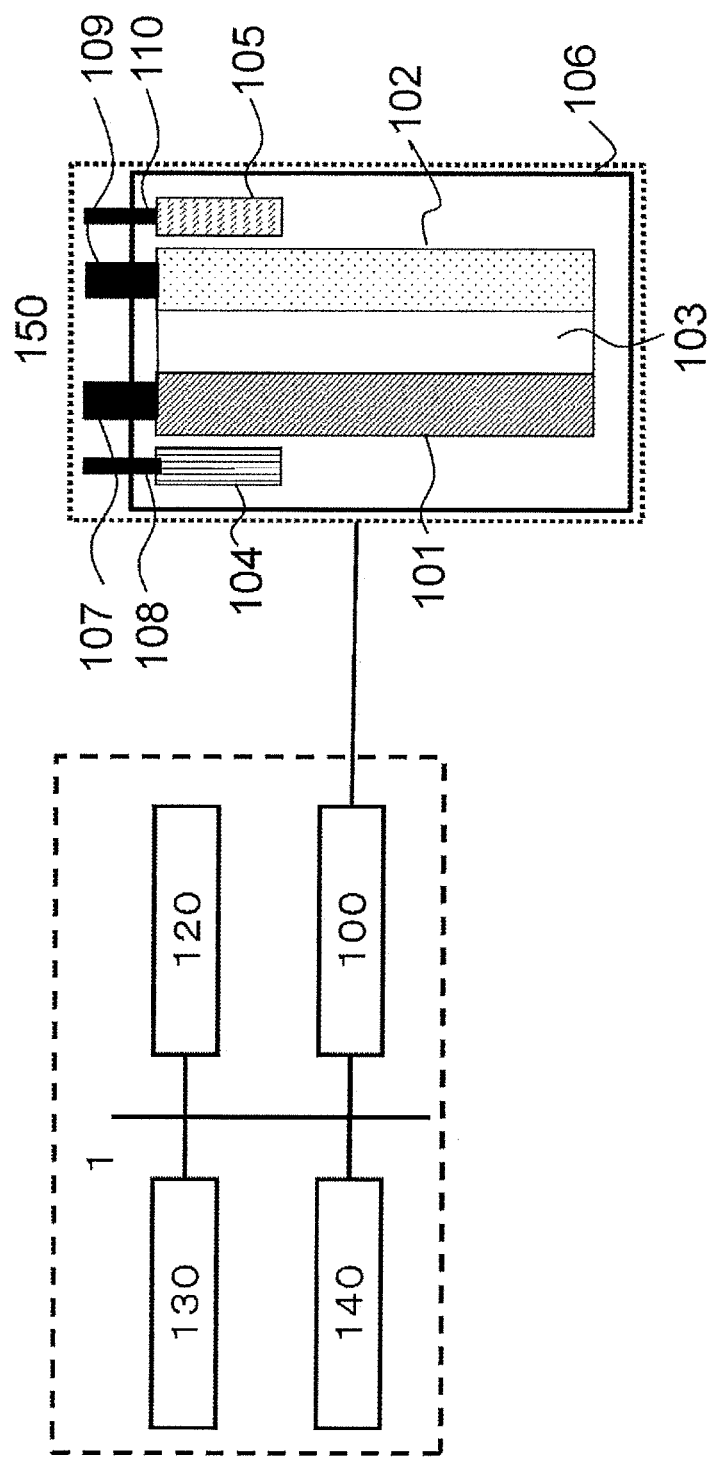
FIG. 1 illustrates a state determination device of a secondary battery in an embodiment of the present invention.

Hereinafter, embodiments of the present invention will be described with reference to the drawings and the like. The following descriptions are specific examples of a content of the present invention, and the present invention is not limited to these descriptions. Numerous variations and modifications can be made by those skilled in the art within the scope of technical ideas disclosed in this specification. Further, same reference numerals are assigned to components having identical functions throughout the drawings for describing the present invention, and repetitive descriptions thereof may be omitted.

<Overall Configuration and Outline of Operation of Each Part>

FIG. 1 illustrates a state determination device of a secondary battery in an embodiment of the present invention. A lithium ion secondary battery will be described below as the secondary battery. However, the present invention is not limited to this. Further, the state determination device of the present invention is applicable to a secondary battery in an initial state which is not deteriorated. However, the secondary battery will be described below as a deteriorated one.

In FIG. 1, a state determination device (a deterioration diagnostic device) 1 includes a battery controller 100, a calculator 140, a memory 120, and an output unit 130. Those units are connected to each other by a bus or the like. A lithium ion secondary battery 150 is connected to the battery controller 100.

The battery controller 100 causes a predetermined current value to flow to the lithium ion secondary battery 150 until a charge and discharge time reaches a predetermined value or a battery voltage of the lithium ion secondary battery 150 reaches a predetermined value. During this time, a charge and discharge current, the charge and discharge time, and the battery voltage are measured as needed, and a correspondence relationship between a charge and discharge capacity obtained by the predetermined current value and the battery voltage is stored in the memory 120 as an actually measured value of a charging and discharging curve.

The memory 120 stores: the measured charging and discharging curve of the lithium ion secondary battery 150; a charging and discharging curve per reference quantity of a positive electrode and a negative electrode used for the lithium ion secondary battery 150; physical property values of a positive electrode material, a negative electrode material, and an electrolytic solution used for the lithium ion secondary battery 150; and initial values of a capacity reduction parameter group and a resistance increase parameter group to be used for state determination, that is, values for the secondary battery 150 which is not deteriorated. In addition to the charge and discharge of the lithium ion secondary battery 150, it is desirable that the above-described charging and discharging curve be measured by using a minute current as potentials of the positive electrode and the negative electrode relative to a reference potential. Further, the memory 120 stores, as needed, physical property values of members of the lithium ion secondary battery 150 necessary to reproduce a charging and discharging curve B, which will be described below, and a charge and discharge current value and charge and discharge time dependency of a calculation parameter.

The calculator 140 calculates the charging and discharging curve of the lithium ion secondary battery 150 while referring or overwriting, as needed, the charging and discharging curves of the positive electrode and the negative electrode, the physical property values of the positive electrode material, the negative electrode material, and the electrolytic solution, and the values of the capacity reduction parameter group and the resistance increase parameter group, which are stored in the memory 120. Then, the calculator 140 determines values of the capacity reduction parameter group and the resistance increase parameter group so as to reproduce the actually measured values of the charging and discharging curve. Further, if necessary, the calculator 140 calculates a response characteristic of the lithium ion secondary battery 150 to a predetermined load by using the determined values of the parameter groups.

The output unit 130 outputs the values of the capacity reduction parameter group and the resistance increase parameter group determined by the calculator 140, or the response characteristic of the lithium ion secondary battery 150 calculated based on these parameters to a display device for a user, a battery operation controller 100, a battery life predictor, and the like. The response characteristic includes, for example, a charging and discharging curve of the lithium ion secondary battery 150 in a case where an arbitrary current value is flowed, internal resistance of the lithium ion secondary battery 150 at an arbitrary discharge time, a positive electrode potential and a negative electrode potential in a case where an arbitrary current value is charged and discharged for an arbitrary time, and the like.

The lithium ion secondary battery 150 is configured so that an electrode group including a positive electrode 101, a separator 103, and a negative electrode 102, a positive electrode reference electrode 104, and a negative electrode reference electrode 105 are installed in a battery case 106.

The electrode group has a configuration in which the positive electrode 101, the separator 103, the negative electrode 102, and the separator 103 are wound by overlapping alternately. Alternatively, the electrode group has a configuration in which the positive electrode 101, the separator 103, the negative electrode 102, and the separator 103 are laminated by overlapping alternately. In a case where the electrode group is wound, a shape of the battery is cylindrical, flat oval, circular, or rectangular. In a case where the electrode group is wound, the shape is rectangular, laminated, or the like. Any shape may be selected.

The positive electrode 101, the negative electrode 102, the positive electrode reference electrode 104, and the negative electrode reference electrode 105 are disposed separately from each other through the electrolytic solution. As the electrolytic solution, a nonaqueous solution in which 1 mol/l of lithium hexafluorophosphate is dissolved as lithium salt is injected into a mixed solvent of ethylene carbonate and diethyl carbonate having a volume ratio of 1:1.

The positive electrode 101 contains a positive electrode active material which is capable of inserting and desorbing a lithium ion reversibly and is composed of lithium-containing oxide. As the positive electrode active material, layered transition metal oxide having a substitution element or not having the substitution element, lithium transition metal phosphate, spinel-type transition metal oxide, and the like can be cited. For example, as the layered transition metal oxide, lithium nickel oxide $LiNiO_2$ and lithium cobalt oxide $LiCoO_2$ can be cited. As the lithium transition metal phosphate, lithium iron phosphate $LiFePO_4$, lithium manganese phosphate $LiMnPO_4$, and the like can be cited. As the spinel-type transition metal oxide, lithium manganate $LiMn_2O_4$ and the like can be cited. One type or two or more types of the above-described materials may be contained as the positive electrode active material. The lithium ion is desorbed from the positive electrode active material in the positive electrode 101 in a charging process, and a lithium ion desorbed from a negative electrode active material in the negative electrode 102 is inserted into the positive electrode active material in a discharging process.

The negative electrode 102 contains a negative electrode active material which is capable of inserting and desorbing a lithium ion reversibly. The negative electrode active material is composed of, for example, a carbon material, silicon-based materials Si, SiO, lithium titanate having a substitution element or not having the substitution element, lithium vanadium composite oxide, an alloy made of lithium and a metal, such as tin, aluminum, antimony, or the like. As the carbon material, natural graphite, a composite carbonaceous material in which a film is formed on the natural graphite by a dry CVD method or a wet spray method, artificial graphite produced by burning a resin material, such as epoxy or phenol, or a pitch-based material obtained from oil or coal as a raw material, a non-graphitizable carbon material, and the like can be cited. One type or two or more types of the above-described materials may be contained as the negative electrode active material. In the negative electrode active material in the negative electrode 102, an insertion desorption reaction or a conversion reaction of the lithium ion proceeds in a charging and discharging process.

For example, a separator made of polypropylene is used for the separator 103 used between the positive electrode 101 and the negative electrode 102. Besides the polypropylene, a microporous film or a nonwoven fabric made of polyolefin, such as polyethylene, can be used.

A positive electrode terminal 107, a negative electrode terminal 109 are respectively energized with the positive electrode 101, the negative electrode 102. The lithium ion secondary battery 120 is charged and discharged by an external circuit through the positive electrode terminal 107, the negative electrode terminal 109. The positive electrode reference electrode 104 and the negative electrode reference electrode 105 are respectively energized with a positive electrode reference electrode terminal 108 and a negative electrode reference electrode terminal 110.

Since the positive electrode reference electrode 104 is connected with the positive electrode 101 and the negative electrode reference electrode 105 is connected with the negative electrode 102, the positive electrode potential can be measured. As the positive electrode reference electrode 104 and the negative electrode reference electrode 105, any one or more of lithium manganese spinel, a lithium alloy, lithium titanate, lithium transition metal phosphate, and metallic lithium can be cited.

<Operation of Calculation Part>

Figure 2:
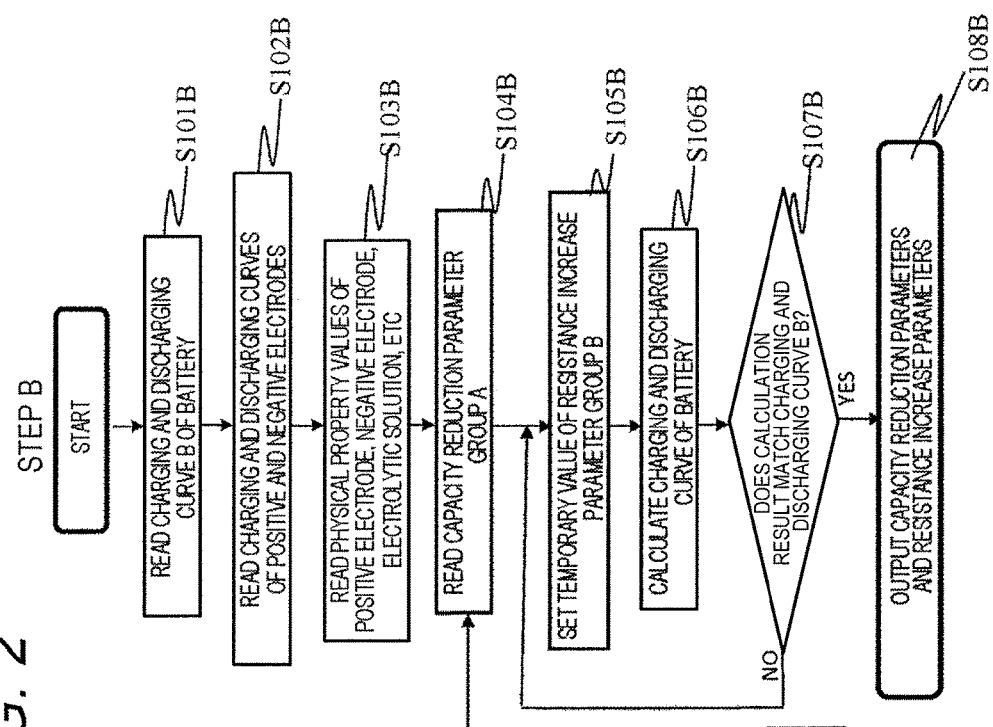
FIG. 2 is a flowchart illustrating an operation of a calculator.
Figure 2:
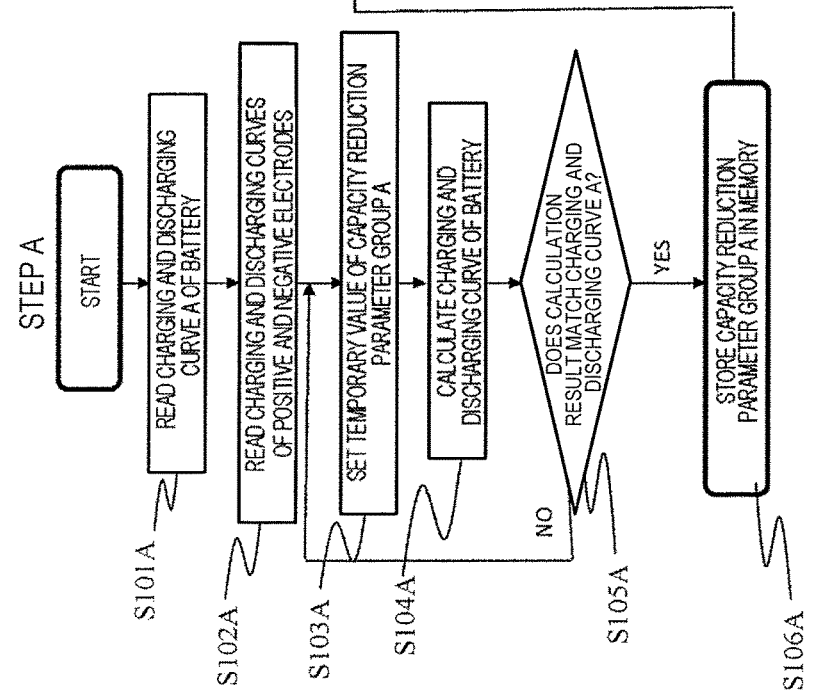

Hereinafter, operation of the calculator 140 is concretely described with reference to FIG. 2. FIG. 2 is a flowchart illustrating the operation of the calculator.

<Step A>

First, the calculator 140 reproduces a charging and discharging curve A of the lithium ion secondary battery 150 based on the charging and discharging curves of the positive electrode and the negative electrode and determines an optimum value of a capacity reduction parameter group A. The capacity reduction parameter group A is a parameter group necessary to reproduce the charging and discharging curve A which has been measured at a relatively small current. The capacity parameter group A includes effective masses of the positive electrode active material and the negative electrode active material, capacity deviations of the positive electrode and the negative electrode generated between a predetermined battery voltage and predetermined positive electrode and negative electrode potentials, and the like.

When the calculation is started, in step S101A, the calculator 140 reads, from the memory 120, the charging and discharging curve A of the lithium ion secondary battery 150 measured by using a predetermined current value (a current density) A. As the predetermined current value A, it is desirable that a voltage drop caused by internal resistance of the lithium ion secondary battery 150 is sufficiently small with respect to the battery voltage. Specifically, it is desirable that the value be a current value $0.2*Q\_0$ (A) or less which requires five hours to discharge a normal capacity $Q\_0$ (Ah) of the secondary battery 150, and more desirable that the value be a current value $0.1*Q\_0$ (A) or less which requires ten hours. Further, as an example of the charging and discharging curve, a battery potential V (V) with respect to a charge and discharge capacity Q (Ah), a differential dV/dQ by the capacity of the battery voltage with respect to the charge and discharge capacity Q, a differential value dQ/dV by the battery voltage of the charge and discharge capacity with respect to the battery voltage V, and the like. Hereinafter, a case where a relationship of the battery voltage V to the discharge capacity Q is used will be described.

Figure 3:
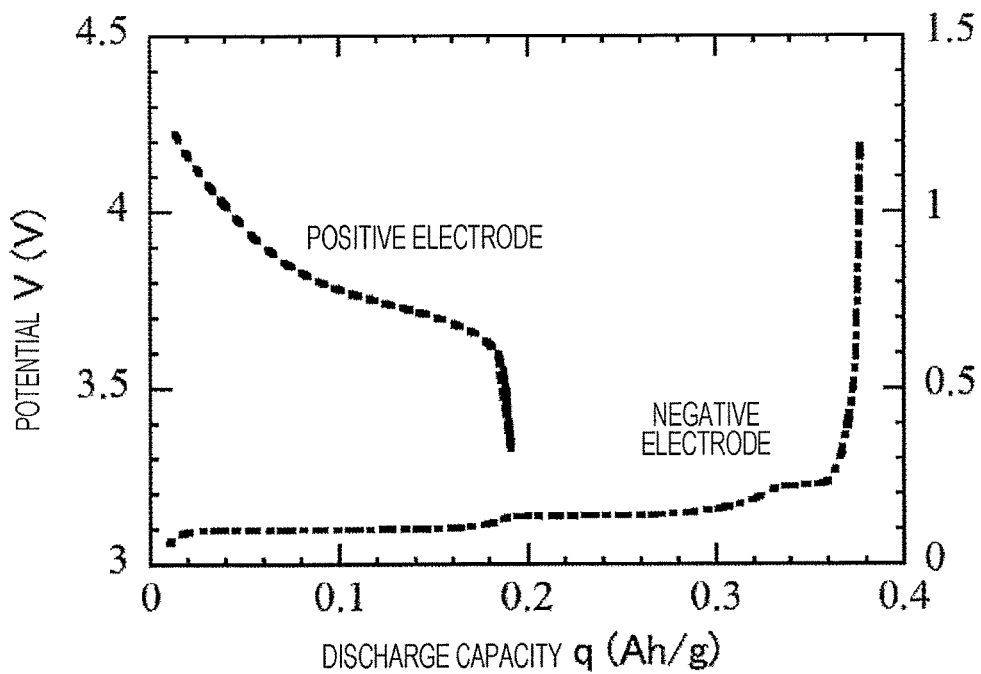
FIG. 3 illustrates discharging curves per unit mass of a positive electrode active material and a negative electrode active material.

Subsequently, in step S102A, charging and discharging curves (charge and discharge characteristics) per reference quantity of the positive electrode and the negative electrode of the lithium ion secondary battery 150 similarly stored in the memory 120 are read. The charging and discharging curves are measured separately and stored in the memory 120 in advance. For example, a test cell in which the positive electrode or the negative electrode is used for a working electrode and lithium metal is used for a counter electrode and a reference electrode is produced, a relationship between the charge and discharge capacity and the potential of the positive electrode or the negative electrode with respect to the reference electrode in a case where a certain current value is flowed is measured, and the charge and discharge capacity is corrected to a value per reference quantity. As an example of the reference quantity, there are a unit mass of the positive electrode active material or the negative electrode active material, a unit area of the positive electrode or the negative electrode, and the like. Hereinafter, description will be given of a case where the unit mass of the positive electrode active material or the negative electrode active material is the reference quantity. Further, it is desirable that the current value at this time be $0.2*Q\_1$ (A) or less with respect to the capacity $Q\_1$ (Ah) indicated by the positive electrode or the negative electrode in a predetermined potential range, and more desirable that the current value be $0.1*Q\_1$ (A) or less. The charging and discharging curve is appropriately selected according to a kind of the charging and discharging curve of the secondary battery 150. A case where a relationship of the battery voltage V (V) to a discharge capacity q (Ah/g) per unit mass of the positive electrode active material or the negative electrode active material will be described below. FIG. 3 illustrates discharging curves Vp (qp), Vn (qn) per unit mass of the positive electrode active material and the negative electrode active material, which will be used in the following description.

Subsequently, in step S103A, a temporary value of the capacity reduction parameter group A required for calculating the charging and discharging curve A of the lithium ion secondary battery 150 is set. The temporary value of the capacity reduction parameter group A may be a predetermined value. Alternatively, if the state of the secondary battery has been previously determined and a result thereof is held, the previously-determined value of the capacity reduction parameter group A may be used. As the capacity reduction parameter group A, for example, there are combinations of any one set of: the effective masses of the positive electrode active material and the negative electrode active material and a ratio of the effective masses of the positive electrode active material and the negative electrode active material to an amount of charge; the effective areas of the positive electrode and the negative electrode and a ratio of the effective areas of the positive electrode and the negative electrode to a projected area; the capacities of the positive electrode and the negative electrode and a ratio of the capacities of the positive electrode and the negative electrode to an initial capacity; or amounts equivalent thereto, and any one set of: charge and discharge capacities between the predetermined positive electrode and negative electrode potentials and the predetermined battery voltage; charge and discharge capacities per reference quantity between the predetermined positive electrode and negative electrode potentials and the predetermined battery voltage; charge and discharge capacities per reference quantity of the positive electrode and the negative electrode to the predetermined battery voltage; or amounts equivalent thereto. Hereinafter, description will be given of a case where effective masses mp, mn of the positive electrode active material and the negative electrode active material and charge and discharge capacities δp, δn between the predetermined positive electrode and negative electrode potentials and the predetermined battery voltage are used. It should be noted that a case where the predetermined positive electrode potential is set to 4.3 V, the predetermined negative electrode potential is set to 0.01 V, and the battery voltage is set to 4.1 V will be described.

Subsequently, in step S104A, a charging and discharging curve of the lithium ion secondary battery 150 is calculated from the charging and discharging curves of the positive electrode and the negative electrode and the capacity reduction parameter group A. The method is disclosed in PTL 1. Only a rough outline of the method is given. By using the potential Vp (qp) of the positive electrode and the potential Vn (qn) of the negative electrode, the battery voltage V(Q) in the capacity Q of the secondary battery can be calculated by the following formula (1). Further, by using a product mp*qp of the effective mass of the positive electrode active material and a charge and discharge quantity with respect to the positive electrode active material in the unit mass, the charge and discharge capacity δp between the predetermined positive electrode potential and the predetermined battery voltage, a product mn*qn of the effective mass of the negative electrode active material and the charge and discharge quantity with respect to the negative electrode active material in the unit mass, the charge and discharge capacity δn between the predetermined negative electrode potential and the predetermined battery voltage, the capacity Q of the secondary battery can be calculated by the following formula (2).

$$V(Q)=Vp(qp)-Vn(qn) \quad \text{Formula (1)}$$

$$Q=mp*qp+\delta p=mn*qn+\delta n \quad \text{Formula (2)}$$

Figure 4:
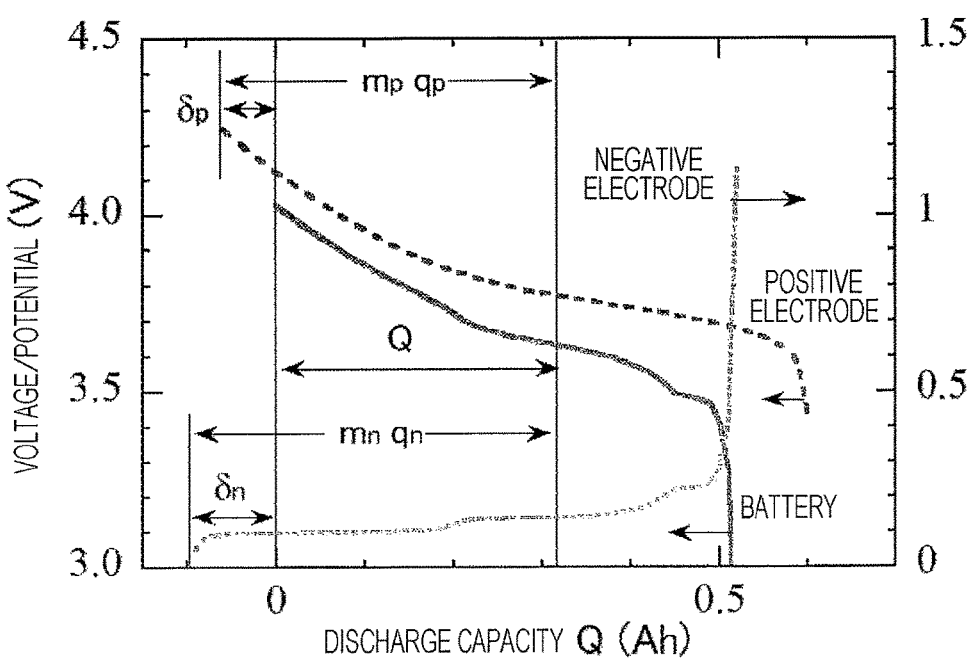
FIG. 4 is an exemplary diagram illustrating a relationship between discharging curves of a secondary battery, a positive electrode, a negative electrode and capacity reduction parameters.

FIG. 4 illustrates a relationship between an example of the discharging curves of the secondary battery, the positive electrode, and the negative electrode calculated by using the discharging curves Vp(qp), Vn(qn) per unit mass of the positive electrode active material and the negative electrode active material and the formulas (1), (2) and the respective parameters in the formula (2).

After that, in step S105A, the calculated charging and discharging curve of the lithium ion secondary battery 150 and an actually measured charging and discharging curve A of the lithium ion secondary battery 150 are compared, and the capacity reduction parameter group A is optimized. For example, a capacity reduction parameter group in which a sum of squares of a difference between the actually measured value and the calculated value of the voltage V(Q) with respect to the capacity Q becomes the least is searched. If the calculated charging and discharging curve of the lithium ion secondary battery 150 and the actually measured charging and discharging curve A of the lithium ion secondary battery 150 match, the process goes to step S106A. If the curves do not match, the process returns to step S103A, and a temporary value of the capacity reduction parameter group A is set again.

After that, in step S106A, an optimized value of the capacity reduction parameter group A is stored in the memory 120.

<Step B>

Next, the calculator 140 reproduces a charging and discharging curve B of the secondary battery based on the charging and discharging curves of the positive electrode and the negative electrode, the optimum capacity reduction parameter group A, the physical property values stored in the memory 120, and the like and determines an optimum value of a resistance increase parameter group B. The resistance increase parameter group B is a parameter group which is not included in the capacity reduction parameter group A among parameter groups necessary to reproduce the charging and discharging curve B measured by using a relatively large current. Examples of parameters included in the resistance increase parameter group B are: decrease rates of effective weights of the positive electrode active material and the negative electrode active material at a current value B to the current value; decrease rates of the capacity deviations of the positive electrode and the negative electrode at the current value B to the current value; internal resistance which does not depend on either the charge and discharge current or the charge and discharge time; internal resistance which depends on one or both of the charge and discharge current and the charge and discharge time; reaction surface areas, reaction rate constants, interface resistance, porosity coefficients, and tortuosity factors of the respective positive electrode and negative electrode; conductivity, salt concentration, viscosity, composition ratio of the electrolytic solution; and the like.

When the calculation is started, in step S101B, the calculator 140 reads, from the memory 120, the charging and discharging curve B of the lithium ion secondary battery 150 measured by using the predetermined current value B. The predetermined current value B is a value larger than the current value A. It is desirable that the current value B is a value in which the voltage drop caused by the internal resistance of the secondary battery 150 is not negligible with respect to the battery voltage. Specifically, it is desirable that the value be $0.5*Q\_0$ or more and $30*Q\_0$ (A) or less with respect to the normal capacity Q_0 (Ah) of the lithium ion secondary battery 150, and more desirable that the value be 2*Q_0 or more and 10*Q_0 (A) or less.

Subsequently, in step S102B, charging and discharging curves per reference quantity of the positive electrode and the negative electrode of the lithium ion secondary battery 150 are read from the memory 120.

Subsequently, in step S103B, the physical property values of the positive electrode, negative electrode, and the electrolytic solution stored in the memory 120 are read as needed. Examples of the physical property values are salt concentration of the electrolytic solution, ion conductivity of the electrolytic solution, temperature dependency of the ion conductivity of the electrolytic solution, a rate constant of an electrochemical reaction on an interface between the positive electrode or the negative electrode and the electrolytic solution, resistance of a film generated on a surface of the positive electrode active material or the negative electrode active material, a surface area of the interface, a diffusion coefficient of electrochemical reactive species in the positive electrode or the negative electrode, and the like. Also, a structure parameter of the lithium ion secondary battery 150 stored in the memory 120 is read as needed. Examples of the structure parameter are resistance of the metallic member of the lithium ion secondary battery 150, thicknesses of the positive electrode and the negative electrode, areas of the positive electrode and the negative electrode, the porosities of the positive electrode and the negative electrode, the tortuosity factors of the positive electrode and the negative electrode, and the like. Further, an operation parameter of the lithium ion secondary battery 150 stored in the memory 120 is read as required. Examples of the operation parameter are the discharge current, battery voltages at a start and an end of discharge, an environmental temperature, and the like.

Subsequently, in step S104B, the value of the capacity reduction parameter group A optimized in Step A is read from the memory 120 in order to reproduce charging and discharging curves in step S106B. The value of the capacity reduction parameter group A may be converted as necessary when the charging and discharging curve B is calculated below.

Subsequently, in step S105B, a temporary value of the resistance increase parameter group B required for calculating the charging and discharging curve B of the lithium ion secondary battery 150 is set. The temporary value of the resistance increase parameter group B may be a predetermined value. Alternatively, if a state of the lithium ion secondary battery 150 has been previously determined and a result thereof is held, the previously-determined value of the resistance increase parameter group B may be used for the temporary value. As the resistance increase parameter group B, there are, for example, decrease rates of the positive electrode and negative electrode capacities, a deviation of the charge and discharge capacity, the internal resistance of the lithium ion secondary battery 150, and the like. Moreover, a part of the physical property value and the structure parameter read in step S104B may be used as the resistance increase parameter group B. Hereinafter, a case where ion conductivity $\sigma$ of the electrolytic solution and resistance Rf of the film generated on the surface of the positive electrode are used will be described.

Subsequently, in step S106B, a charging and discharging curve of the lithium ion secondary battery 150 is calculated from the charging and discharging curves of the positive electrode and the negative electrode, the capacity reduction parameter group A, and the resistance increase parameter group B. A method of calculating the charging and discharging curves by using these parameters is disclosed in NPL 1. Only a rough outline of the method is given. First, a thickness direction in which the positive electrode, the separator, and the negative electrode are laminated is divided into an appropriate number. Next, in each division, while discharge time is increased, equations which represent ion concentration in the electrolytic solution, distribution of ions in the active material, a potential of the active material, a potential of the electrolytic solution, a current in the electrolytic solution, a current in a solid including the active material, a current on an interface between the active material and the electrolytic solution are simultaneously solved at every discharge time. A battery voltage is calculated at every discharge time from a positive electrode potential in a predetermined division and a negative electrode potential in a predetermined division.

Subsequently, in step S107B, the charging and discharging curve B of the actually measured lithium ion secondary battery 150 is reproduced. In other words, the calculated charging and discharging curve of the lithium ion secondary battery 150 and the actually measured charging and discharging curve B of the lithium ion secondary battery 150 are compared, and a value of the resistance increase parameter group B is optimized. If the calculated charging and discharging curve of the secondary battery 150 and the actually measured charging and discharging curve B of the lithium ion secondary battery 150 match, the process goes to step S108B. If the curves do not match, the process returns to step S103B, and the temporary value of the resistance increase parameter group B is set again.

Subsequently, in step S108B, the capacity reduction parameter group A and the resistance increase parameter group B obtained by the above-described calculations, or the results obtained by calculation based on these parameter groups and the charging and discharging curves of the positive and negative electrodes, for example, the positive and negative electrode potentials at the predetermined voltage, or an battery output or the positive and negative electrode potentials at the predetermined charge and discharge current and charge and discharge time, are output to an external memory or an external monitor.

As described above, the state determination device determines the capacity reduction parameter group A based on the charge and discharge characteristics per reference quantity of the positive electrode and the negative electrode and the current value A, and determines the resistance increase parameter group B based on the charge and discharge characteristics per reference quantity of the positive electrode and the negative electrode, the capacity reduction parameter group A, and the current value B which is larger than the current value A. As one example, the state determination device reads the charging and discharging curve A of the secondary battery measured by using the current value A and the charge and discharge characteristics per reference quantity of the positive electrode and the negative electrode. The state determination device temporarily sets the capacity reduction parameter group A. The state determination device calculates the charging and discharging curve of the secondary battery based on the charge and discharge characteristics per reference quantity of the positive electrode and the negative electrode and the temporarily set capacity reduction parameter group A. The state determination device determines the capacity reduction parameter group A based on comparison between the charging and discharging curve of the secondary battery calculated based on the capacity reduction parameter group A and the measured charging and discharging curve A of the secondary battery. The state determination device reads the charging and discharging curve B of the secondary battery measured by using the current value B. The state determination device temporarily sets the resistance increase parameter group B. The state determination device calculates the charging and discharging curve of the secondary battery based on the charge and discharge characteristics per reference quantity of the positive electrode and the negative electrode and the temporarily set resistance increase parameter group B. The state determination device determines the resistance increase parameter group B based on comparison between the charging and discharging curve of the secondary battery calculated based on the resistance increase parameter group B and the measured charging and discharging curve B of the secondary battery. With this configuration, the capacity parameter and the internal resistance parameter of the secondary battery are separated, and the respective values are accurately determined. A deterioration state of the secondary battery can be accurately grasped than before. Further, the secondary battery having high safety and long life can be obtained by the control based on the determination results. Further, accuracy of remaining life prediction based on accumulation of the determination results improves.

The deterioration diagnostic device of the secondary battery in the embodiment of the present invention is connected to a charge and discharge device for a stationary secondary battery or a charge and discharge control apparatus (a charge and discharge control means 500 in FIG. 8) for a secondary battery for a movable body. Alternatively, the device is incorporated as a part of the charge and discharge control apparatus. In this case, regarding a whole or a typical part of a secondary battery module configured by a plurality of secondary batteries, the charge and discharge control apparatus measures the charging and discharging curve A by the minute current value A and the charging and discharging curve B by the current value B larger than the current value A and stores the curves in the memory 120.

FIG. 8 illustrates a secondary battery system in the embodiment of the present invention. A secondary battery system 300 has a state determination device 1, a secondary battery module 200, a measurement means 400, the charge and discharge control means 500. The secondary battery module 200 is configured by the plurality of lithium ion secondary batteries 150. The measurement means 400 has a current sensor 410 which detects a current flowing in the secondary battery module 200 and a voltage sensor 420 which detects a voltage of the secondary battery module 200. The charge and discharge control means 500 has an SOC calculation means 510 which detects each SOC of the plurality of lithium ion secondary batteries 150 in the secondary battery module 200 and an input-output control means 520 which determines a current value at which the secondary battery is charged and discharged.

The charge and discharge current detected by the current sensor 410 and the battery voltage detected by the voltage sensor 420 are transmitted to the calculator 140. The calculator 140 calculates a charge and discharge electric quantity charged and discharged to the secondary battery. The calculator 140 stores a data table of the charge and discharge electric quantity and the battery voltage in the memory 120. The calculator 140, as needed, performs deterioration diagnosis by referring to the data table formed in the memory 120 and transmits a diagnostic result to the charge and discharge control means 500. The SOC calculation means 510 calculates an SOC of the secondary battery based on the diagnostic result, the current value detected by the current sensor 410, and the battery voltage detected by the voltage sensor 420. The calculated SOC of the secondary battery, the diagnostic result, the battery voltage, and the current value are transmitted to the input-output control means 520. The input-output control means 520 determines a current value at which the secondary battery is charged and discharged based on the received information.

In a case where the state determination device in the embodiment of the present invention is applied to the secondary battery for the movable body, when an operation method of the movable body is fixed and a location for charging the secondary battery is determined, the state determination device can be incorporated in the stationary charge and discharge control electric device. In this case, it is possible that the charge and discharge control apparatus on a movable body side and the state determination device are connected at the time of charging and the result of deterioration diagnosis is transferred to the charge and discharge control apparatus. However, when the operation method of the movable body is not fixed and the location for charging the secondary battery is not determined, it is desirable that the state determination device and the charge and discharge control apparatus are both mounted on the movable body.

As described hereinbefore, the state determination device determines the capacity reduction parameter group A and the resistance increase parameter group B based on the charging and discharging curve A and the charging and discharging curve B, which have been measured, according to the above-described method, and outputs the parameter groups to the memory of the charge and discharge control apparatus, the external display device, or the like. However, it is not necessary that the charging and discharging curve A and the charging and discharging curve B are always measured successively. Also, it is not necessary that they are measured one-on-one. For example, it is also possible to perform an operation in which the charging and discharging curve A is measured only once a month and the charging and discharging curve B is measured every day. Similarly, it is not necessary that Step A which determines the capacity reduction parameter group A and Step B which determine the resistance increase parameter group B are always performed successively. It is also not necessary that they are performed one-on-one. For example, in a case where the charging and discharging curve A is measured only once a month and the charging and discharging curve B is measured every day, it is possible to use the capacity reduction parameter group A based on the immediately measured charging and discharging curve A in calculation of Step B and update only the resistance increase parameter group B every day.

Further, it is not necessary that the secondary batteries serving as objects for measuring the charging and discharging curve A and the charging and discharging curve B are not exactly the same. For example, it is also possible that the charging and discharging curve A is measured for the secondary battery selected according to a predetermined method in the entire secondary battery module and the charging and discharging curve B is measured for the entire secondary battery module. Further, since the charging and discharging curve A is measured for the secondary battery selected according to the predetermined method in the entire secondary battery module and the charging and discharging curve B is measured for the entire secondary battery module other than the selected secondary battery, the charging and discharging curve A and the charging and discharging curve B can be measured simultaneously.

Further, it is not always necessary that both of the charging and discharging curve A and the charging and discharging curve B are discharging curves, and similarly, that both of them are charging curves. For example, it is possible that the discharging curve in which the selected secondary battery is discharged at the minute current value A is used for the charging and discharging curve A and that the charging curve in which the entire secondary battery module other than the selected secondary battery is quickly charged is used for the charging and discharging curve B. However, in this case, both of the charging curve and the discharging curve per reference quantity of the positive electrode and the negative electrode need to be stored in the memory 120.

Example 1

Figure 5:
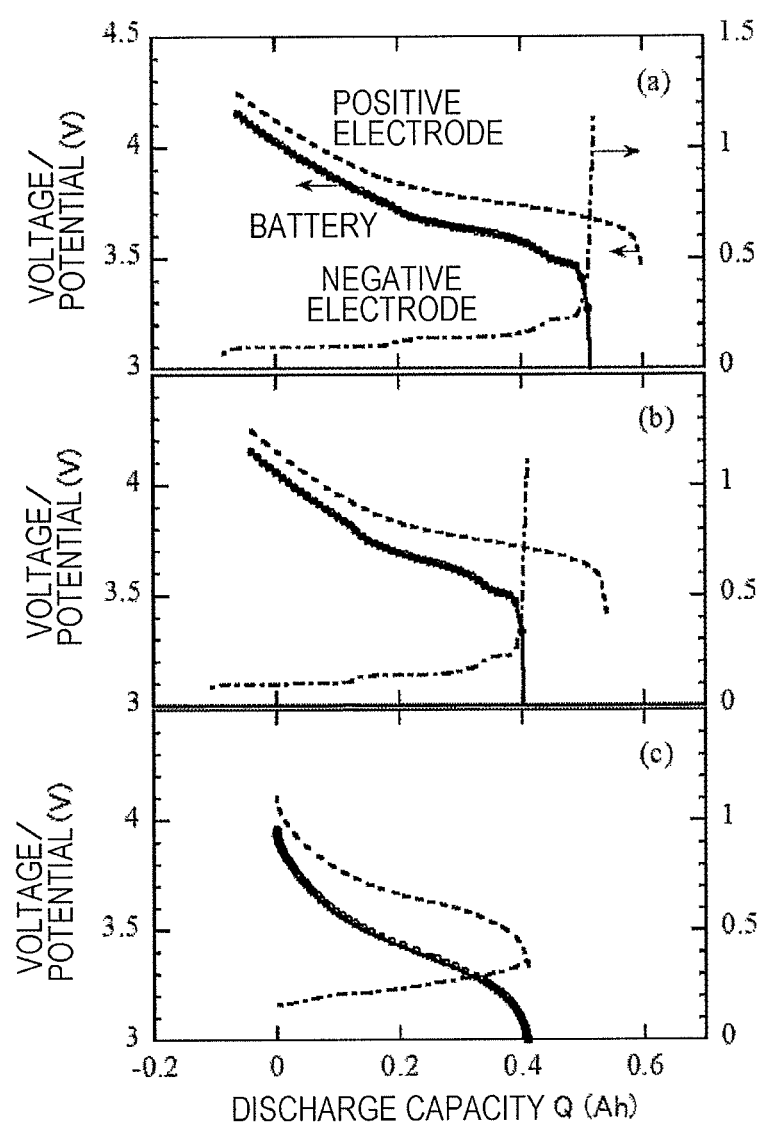
FIGS. 5(a) to 5(c) are reproduction results of discharging curves in the embodiment of the present invention.

FIGS. 5(a) to 5(c) are reproduction results of discharging curves in the embodiment of the present invention, and determination results in which the calculation method described in NPL 1 is used for Step B in the determination according to the embodiment of the present invention. FIG. 5(a) illustrates a discharging curve A measured at a minute current 0.02*Q_0 (A) of the secondary battery in an initial state and a reproduction result thereof. In the drawing, white circles indicate an actually measured discharging curve of the secondary battery, a solid line indicates a calculated discharging curve of the secondary battery 150, a dashed line indicates a calculated discharging curve of the positive electrode, and an alternate long and short dashed line indicates a discharging curve of the negative electrode. Further, FIG. 5(b) illustrates a discharging curve A measured at a minute current 0.02*Q_0 (A) of the secondary battery deteriorated under a predetermined condition and a reproduction result thereof. Further, FIG. 5(c) illustrates a discharging curve B measured at a relatively large current 4*Q_0 (A) of the secondary battery deteriorated under the predetermined condition and a reproduction result thereof. Table 1 illustrates optimized values of the capacity reduction parameter group and the resistance increase parameter group obtained by the reproduction and calculation illustrated in FIGS. 5(a), 5(b), 5(c). Further, root mean square errors (RMSE) between the actually measured values and the calculated values are also illustrated.

Figure 6:
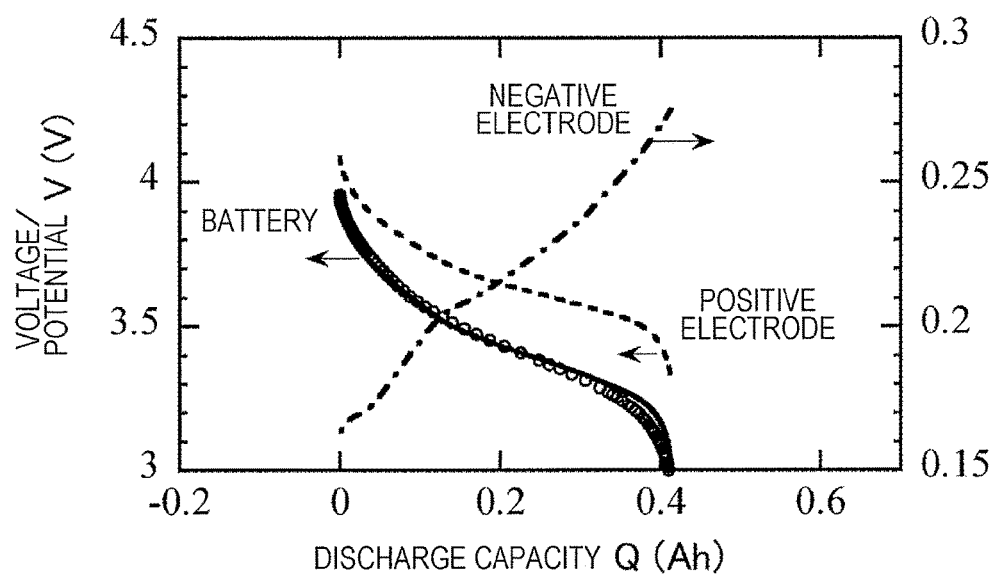
FIG. 6 is a reproduction result of discharging curves in a comparative example of the present invention.

As a comparative example, description is given of a case where a resistance increase parameter group B is evaluated according to the calculation method described in NPL 1 by using the capacity reduction parameter group A for the secondary battery 150 in the initial state without performing the state determination which uses the discharging curve A of the deteriorated secondary battery 150, that is, by using the discharging curve of the battery in the initial state as the discharging curve A instead of the discharging curve of the minute current at that point in time. FIG. 6 illustrates a reproduction result. FIG. 6 is the reproduction result of discharging curves in the comparative example of the present invention. Further, optimized values of the resistance increase parameters and a root mean square error (RMSE) between the actually measured value and the calculated value are illustrated in Table 1.

TABLE 1

|  | FIG 5(a) | FIG 5(b) | FIG. 5(c) | FIG 6 |
| --- | --- | --- | --- | --- |
| mp (g) | 3.642 | 3.181 | 3.181 | 3.642 |
| mm (g) | 1.657 | 1.433 | 1.433 | 1.657 |

TABLE 1-continued

|  | FIG 5(a) | FIG 5(b) | FIG. 5(c) | FIG 6 |
| --- | --- | --- | --- | --- |
| $\delta p$ (Ah) | 0.087 | 0.062 | 0.062 | 0.087 |
| $\delta n$ (Ah) | 0.104 | 0.13 | 0.13 | 0.104 |
| $\sigma$ (S/cm) | — | — | 1.12 | 1.01 |
| Rf ($\Omega$) | — | — | $4.0 \times 10^{-3}$ | $6.1 \times 10^{-3}$ |
| RMSE (V) | 0.0113 | 0.0182 | 0.0258 | 0.043 |

In the state determination by the comparative example (FIG. 6), increase in internal resistance of the secondary battery 150 is estimated to be large as compared with the result of state determination according to the present embodiment (FIG. 5(c)). This result is a difference caused by incorrect evaluation of effects of the capacity reduction parameters expressed even at the minute current. Further, when the root mean square errors are compared, the determination result according to the comparative example is larger than the determination result according to the present embodiment. It is clear that the actually measured value cannot be accurately reproduced.

Example 2

Figure 7:
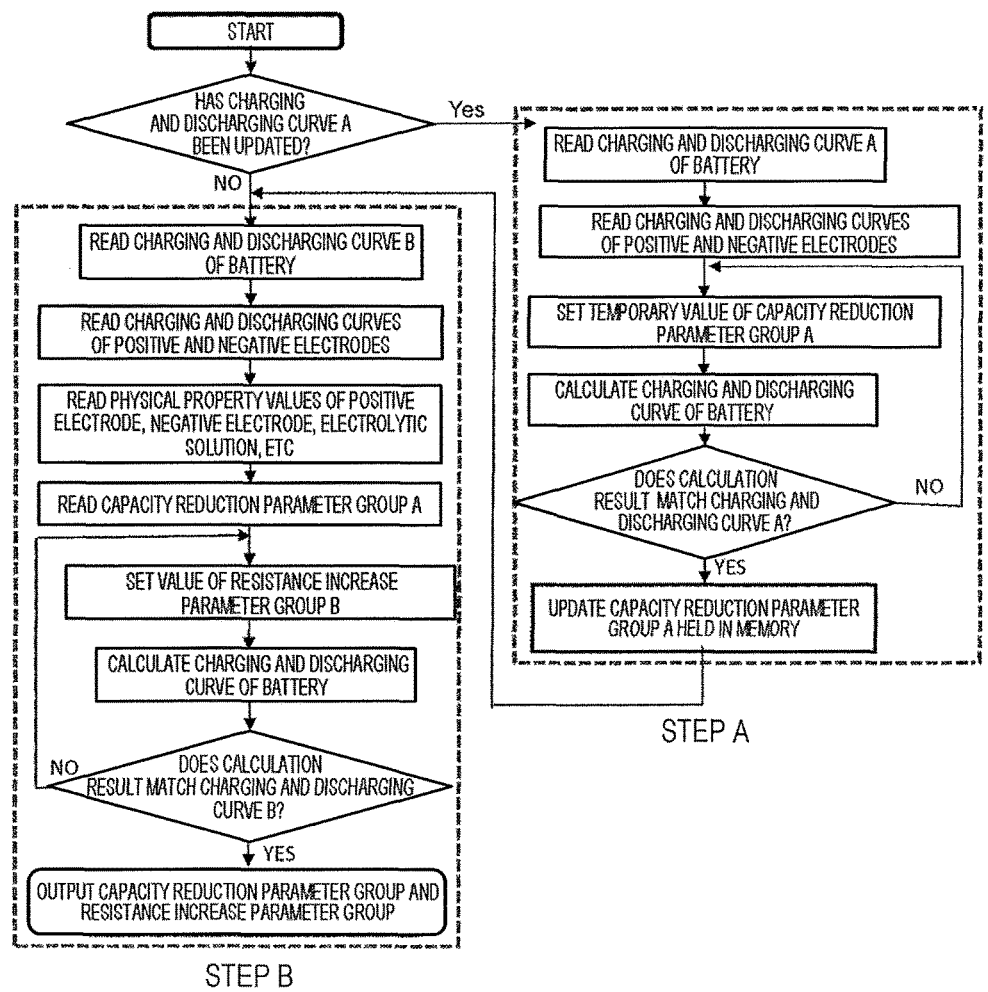
FIG. 7 is a flowchart illustrating an operation of a calculator in an embodiment of the present invention.

In a state determination device of a secondary battery according to another embodiment of the present invention, a configuration of the state determination device is as illustrated in FIG. 1. FIG. 7 is a flowchart illustrating an operation of a calculator in the present embodiment.

When calculation is started, first, it is confirmed whether a charging and discharging curve A held in a memory 120 is updated after a previous state determination time. If the charging and discharging curve A is updated, the determination of Step A in Embodiment 1 is started, and a value of a capacity reduction parameter group A is optimized. After that, the capacity reduction parameter group A stored in the memory 120 is updated to the optimized value.

Next, the determination of Step B in Embodiment 1 is started based on the updated value of the capacity reduction parameter group A, and a value of a resistance increase parameter group B is optimized. Lastly, the values of the capacity reduction parameter group A and the resistance increase parameter group B or characteristics of the secondary battery 150 calculated based on these values are output.

Meanwhile, if the charging and discharging curve A is not updated after the previous state determination time, Step A is omitted, and the determination of Step B is started. In this case, the optimum value of the capacity reduction parameter group A at the previous state determination time stored in the memory 120 is used. However, as needed, it is possible to use a capacity reduction parameter group A corrected based on an arbitrary function which uses, as a variable, the number of days elapsed from the previous determination, the number of charging and discharging cycles of the secondary battery 150 from the previous determination, or the like. Similarly to the above, a charging and discharging curve B is reproduced, and determination results are output.

In the present embodiment, if the charging and discharging curve A is updated after the previous state determination time of the secondary battery, the capacity reduction parameter group A is updated based on the updated charging and discharging curve A, the resistance increase parameter group B is determined based on the updated capacity reduction parameter group A. If the charging and discharging curve A is not updated after the previous state determination time, the resistance increase parameter group B is determined based on the capacity reduction parameter group A used at the previous state determination time of the secondary battery. With this configuration, since it is not always necessary to update the charging and discharging curve A, a time required for measuring the charging and discharging curve A can be saved as compared with Embodiment 1.

Example 3

In a deterioration diagnostic device of a secondary battery according another embodiment of the present invention, a charge and discharge current and a charge and discharge time are set based on estimated values of charge and discharge characteristics of the battery, a positive electrode, and a negative electrode obtained by diagnosis so as not to exceed available potential regions of the positive electrode and the negative electrode. In the present embodiment, a calculator 140 calculates time changes of a battery voltage, a positive electrode potential, and a negative electrode potential in an arbitrary operation condition based on a capacity reduction parameter group A and a resistance increase parameter group B obtained by state determination. Based on the calculation result, the calculator 140 calculates either an upper limit of the charge and discharge current or an upper limit of the charge and discharge time, which are capable of energizing the secondary battery 150. Specifically, the calculator 140 outputs a battery voltage corresponding to an upper limit or a lower limit of a predetermined available potential region of the positive electrode or the negative electrode, a charge and discharge time in which the positive electrode or the negative electrode reaches a forbidden potential region at a predetermined charge and discharge current, a maximum charge and discharge current value in which the positive electrode or the negative electrode does not reach the forbidden potential region in a predetermined charge and discharge time, or the like.

In the present embodiment, the state determination device determines the operation condition of the secondary battery based on the determined capacitor reduction parameter group A and the determined resistance increase parameter B so that the positive electrode and the negative electrode do not reach the forbidden potential regions, respectively. With this configuration, the operation condition of the secondary battery 150 in which the positive electrode and the negative electrode do not reach the respective forbidden potential regions can be determined based on the state determination of the secondary battery 150.

Example 4

In a deterioration diagnostic device of a secondary battery according to another embodiment of the present invention, a remaining life of the battery in a predetermined use condition is determined based on a deterioration diagnosis result of the battery and a predetermined lower limit value of a capacity.

In the present embodiment, state determination has been performed on charge and discharge characteristics of the same secondary battery 150 or the secondary battery having the same configuration measured in different periods of use. Values of a capacity reduction parameter group A and a resistance increase parameter group B obtained by the state determination and a use situation of the secondary battery 150 at a point in time of each state determination are stored in a memory 120. Further, functions of the capacity reduction parameter group A and the resistance increase parameter group B using the use situation as a variable are stored in the memory 120. As a function form, a straight line, a quadratic function, an exponential function, a logarithmic function, or the like can be cited. Further, as the variable, a period of use, a number of charging and discharging cycles, a cumulative quantity of charging and discharging electricity, a temperature, a battery voltage, an electrode potential, or the like can be cited.

A calculator 140 reads these functional forms and the variable from the memory 120 and calculates values of the capacity reduction parameter group A and the resistance increase parameter group B before a point in time of the latest state determination. Next, a charging and discharging curve of the secondary battery 150 in the predetermined use condition is predicted based on the calculated values of the capacity reduction parameter group A and the resistance increase parameter group B. Further, a magnitude relation of an upper or a lower limit value to the capacity or internal resistance of the secondary battery 150 obtained from the predicted charging and discharging curve of the secondary battery 150 is determined. In the prediction by calculation, if the capacity or the internal resistance of the secondary battery 150 exceeds a predetermined upper limit value or falls below a predetermined lower limit value at a certain point in time A, this certain point in time A is regarded as a life of the secondary battery 150.

An output unit 130 outputs the point in time A or a period of time B from a current time to the point in time A. Further, if the period of time B is shorter than a predetermined minimum period of time C, warning is output.

According to the above-described procedure, the life of the secondary battery can be predicted based on the values of the capacity reduction parameter group A and the resistance increase parameter group B.

REFERENCE SIGNS LIST 1 state determination device
100 battery controller
101 positive electrode
102 negative electrode
103 separator
104 positive electrode reference electrode
105 negative electrode reference electrode
106 battery case
107 positive electrode terminal
108 positive electrode reference electrode terminal
110 negative electrode reference electrode terminal
120 memory
130 output unit
140 calculator
150 lithium ion secondary battery
200 secondary battery module
300 secondary battery system
400 measurement means
410 current sensor
420 voltage sensor
500 charge and discharge control means
510 SOC calculation means
520 input-output control means

The invention claimed is:
1. A state determination device that improves accuracy of measuring deterioration in a secondary battery having a positive electrode and a negative electrode, the state determination device comprising:
a current sensor that measures a current of the secondary battery;
a controller communicatively coupled to the current sensor, wherein the controller;

receives a current value A from the current sensor, retrieves, from a memory of the controller, charge and discharge characteristics per reference quantity of the positive electrode and the negative electrode, determines a capacity reduction parameter group A based on the charge and discharge characteristics and the current value A, receives a current value B from the current sensor, and determines a resistance increase parameter group B based on the charge and discharge characteristics, the capacity reduction parameter group A, and the current value B, wherein the current value B is larger than the current value A.

2. The state determination device according to claim 1, wherein the controller further:

reads a charging and discharging curve A of the secondary battery measured by using the current value A and the charge and discharge characteristics per reference quantity of the positive electrode and the negative electrode, temporarily sets a capacity reduction parameter group A, calculates a charging and discharging curve of the secondary battery based on the charge and discharge characteristics per reference quantity of the positive electrode and the negative electrode and the temporarily set capacity reduction parameter group A, determines a capacity reduction parameter group A based on comparison between the charging and discharging curve of the secondary battery calculated based on the capacity reduction parameter group A and the measured charging and discharging curve A of the secondary battery, reads a charging and discharging curve B of the secondary battery measured by using the current value B, temporarily sets a resistance increase parameter group B, calculates a charging and discharging curve of the secondary battery based on the charge and discharge characteristics per reference quantity of the positive electrode and the negative electrode and the temporarily set resistance increase parameter group B, and determines a resistance increase parameter group B based on comparison between the charging and discharging curve of the secondary battery calculated based on the resistance increase parameter group B and the measured charging and discharging curve B of the secondary battery.

3. The state determination device according to claim 2, wherein if the charging and discharging curve A has been updated after the previous state determination time of the secondary battery, the capacity reduction parameter group A is updated based on the updated charging and discharging curve A, the resistance increase parameter group B is determined based on the updated capacity reduction parameter group A, and if the charging and discharging curve A has not been updated after the previous state determination time, the resistance increase parameter group B is determined based on the charging and discharging curve A used at the previous state determination time of the secondary battery.

4. The state determination device according to claim 1, wherein the controller further:

determines an operation condition of the secondary battery based on the determined capacity reduction parameter group A and the determined resistance increase parameter group B so that each of the positive electrode and the negative electrode does not reach a forbidden potential region.

5. The state determination device according to claim 1, wherein the controller further:

predicts a life of the secondary battery based on the determined capacity reduction parameter group A and the determined resistance increase parameter group B.

6. A secondary battery system, comprising:

a secondary battery module having a plurality of the secondary batteries; and the state determination device in claim 1.

7. A state determination method that improves accuracy of measuring deterioration in a secondary battery having a positive electrode and a negative electrode, comprising:

receiving, by a controller, a current value A from a current sensor that measures a current of the secondary battery;

retrieving, by the controller, charge and discharge characteristics per reference quantity of the positive electrode and the negative electrode from a memory;

determining, by the controller, a capacity reduction parameter group A based on the charge and discharge characteristics and the current value A;

receiving, by the controller, a current value B from the current sensor; and determining, by the controller, a resistance increase parameter group B based on the charge and discharge characteristics, the capacity reduction parameter group A, and the current value B, wherein the current value B is larger than the current value A.

* * * * *